US010056519B2

United States Patent
Chaudhari et al.

(10) Patent No.: US 10,056,519 B2
(45) Date of Patent: *Aug. 21, 2018

(54) METHODS OF GROWING HETEROEPITAXIAL SINGLE CRYSTAL OR LARGE GRAINED SEMICONDUCTOR FILMS AND DEVICES THEREON

(71) Applicants: Karin Chaudhari, Briarcliff Manor, NY (US); Ashok Chaudhari, Briarcliff Manor, NY (US); Pia Chaudhari, Briarcliff Manor, NY (US)

(72) Inventors: Praveen Chaudhari; Ashok Chaudhari, Briarcliff Manor, NY (US)

(73) Assignee: Solar-Tectic, LLC, Briarcliff Manor, NY (US)

(*) Notice: Subject to any disclaimer, the term of this patent is extended or adjusted under 35 U.S.C. 154(b) by 181 days.

This patent is subject to a terminal disclaimer.

(21) Appl. No.: 15/157,539

(22) Filed: May 18, 2016

(65) Prior Publication Data

US 2016/0260863 A1  Sep. 8, 2016

Related U.S. Application Data

(63) Continuation-in-part of application No. 13/929,085, filed on Jun. 27, 2013, now Pat. No. 9,722,130, which (Continued)

(51) Int. Cl.
*H01L 21/02* (2006.01)
*H01L 31/18* (2006.01)
(Continued)

(52) U.S. Cl.
CPC ............ *H01L 31/18* (2013.01); *C30B 23/025* (2013.01); *C30B 25/02* (2013.01); *C30B 25/183* (2013.01); *C30B 29/06* (2013.01); *H01L 21/02422* (2013.01); *H01L 21/02488* (2013.01); *H01L 21/02532* (2013.01); *H01L 21/02535* (2013.01); *H01L 21/02631* (2013.01);
(Continued)

(58) Field of Classification Search
CPC ......... H01L 21/02603; H01L 21/02645; H01L 21/02653; H01L 21/02532; B82Y 40/00; C30B 11/12; C30B 29/06
See application file for complete search history.

(56) References Cited

U.S. PATENT DOCUMENTS 4,534,820 A * 8/1985 Mori ....................... C30B 11/12
117/58
4,717,688 A   1/1988 Jaentsch
(Continued)

OTHER PUBLICATIONS

Kim et al. "10.5% Efficient Polymer and Amorphous Silicon Hybrid Tandem Photovoltaic Cell", Nature Communications, Mar. 4, 2015, pp. 1-6, Macmillan Publishers, US.

(Continued)

*Primary Examiner* — Matthew J Song
(74) *Attorney, Agent, or Firm* — Danielle C. Sullivan; Carter Ledyard & Milburn LLP

(57) ABSTRACT

A method is provided for depositing textured wide bandgap materials, such as polymers or perovskites, on a textured transparent conducting oxide on inorganic thin-film, which serves as a recombination layer, or interfacial conducting layer (ICL), for tandem or multi junction solar cells.

14 Claims, 1 Drawing Sheet

Related U.S. Application Data is a continuation of application No. 12/903,750, filed on Oct. 13, 2010, now Pat. No. 8,491,718, which is a continuation-in-part of application No. 12/774,465, filed on May 5, 2010, now Pat. No. 9,054,249, which is a continuation of application No. 12/154,802, filed on May 28, 2008, now abandoned.

(51) Int. Cl.

| | | |
|---|---|---|
| *H01L 31/0236* | (2006.01) | |
| *H01L 31/0725* | (2012.01) | |
| *C30B 23/02* | (2006.01) | |
| *C30B 25/02* | (2006.01) | |
| *C30B 25/18* | (2006.01) | |
| *C30B 29/06* | (2006.01) | |
| *H01L 51/00* | (2006.01) | |
| *H01L 51/44* | (2006.01) | |

(52) U.S. Cl.
CPC .. *H01L 21/02694* (2013.01); *H01L 31/02363* (2013.01); *H01L 31/02366* (2013.01); *H01L 31/0725* (2013.01); *H01L 51/0037* (2013.01); *H01L 51/447* (2013.01); *H01L 2251/105* (2013.01)

(56) References Cited

U.S. PATENT DOCUMENTS

| | | | |
|---|---|---|---|
| 5,326,719 A | | 7/1994 | Green et al. |
| 5,544,616 A | | 8/1996 | Ciszek et al. |
| 5,897,331 A | * | 4/1999 | Sopori ............... H01L 21/2026 136/258 |
| 5,916,375 A | * | 6/1999 | Agui ............... H01L 31/022466 136/258 |
| 6,429,035 B2 | | 8/2002 | Nakagawa et al. |
| 6,784,139 B1 | | 8/2004 | Sankar et al. |
| 8,912,036 B2 | | 12/2014 | Forrest et al. |
| 8,933,436 B2 | | 1/2015 | Forrest et al. |
| 9,859,450 B2 | * | 1/2018 | Chaudhari .......... H01L 31/0322 |
| 2015/0267289 A1 | | 9/2015 | Vispute et al. |
| 2015/0298161 A1 | | 10/2015 | Beeckman et al. |

OTHER PUBLICATIONS

Kass et al., "Liquid Phase Epitaxy of Silicon: Potentialities and Prospects", Max Planck Institute, Stuttgart, DE., Physica, 129B, 1985, pp. 161-165, Elsevier, Holland.

Massalski et al. "Binary Alloy Phase Diagrams", 1990, pp. 425-431, vol. 1, 2nd. Ed., The Materials Information Society, US.

Findikoglu et al., "Well-Oriented Silicon Thin Films with High Carrier Mobility on Polycrystalline Substrates", Advanced Materials, 2005, pp. 1527-1531, Wiley-VCH Verlag etc., Wernheim, DE.

Teplin et al. "A Proposed Route to Thin Film Crystal Si Using Biaxially Textured Foreign Template Layers", National Renewable Energy Laboratory, Conference Paper, Nov. 2005, pp. 1-4, U.S. Dept. of Energy, US.

Goyal et al., The Rabits Approach:Using Rolling-Assisted Biaxially Textured Substrates for High-Performance YBCO Superconductors, MRS Bulletin, Aug. 2004, pp. 552-561, mrs.org Publications Bulletin, US.

Nast et al., "Aluminum-Induced Crystallization of Amorphous Slicon on Glass Substrates above and below the Eutectic Temperature", Applied Physics Letters, Nov. 1998, pp. 3214-3216, vol. 73, No. 22, American Institute of Physics, US.

Girault et al., "Liquid Phase Epitaxy of Silicon at Very Low temperatures", Monpellier, FR, Oct. 1976, pp. 169-177, Journal of Crystal Growth 37 (1977), Holland.

Kayes et al., "Comparison of the Device Physics Principle of Planar and Radial p-n Junction Nanorod Solar Cells", Journal of Applied Physics 97, 114302, Dec. 2005, pp. 1-11, America Institute of Physics, US.

Lunt, Richard et al. "Relationship between Crystalline Order and Exciton Diffusion Length in Molecular Organic Semiconductors", Advanced Materials, Material Views, 2010, pp. 1233-1236, vol. 22, Wiley-VCH, Germany.

George, John P. et al. "Preferentially Oriented BaTi03 Thin Films Deposited on Silicon with Thin Intermediate Buffer Layers", Nanoscale Research Letters, 2013, pp. 1-7, Springer, USA.

\* cited by examiner

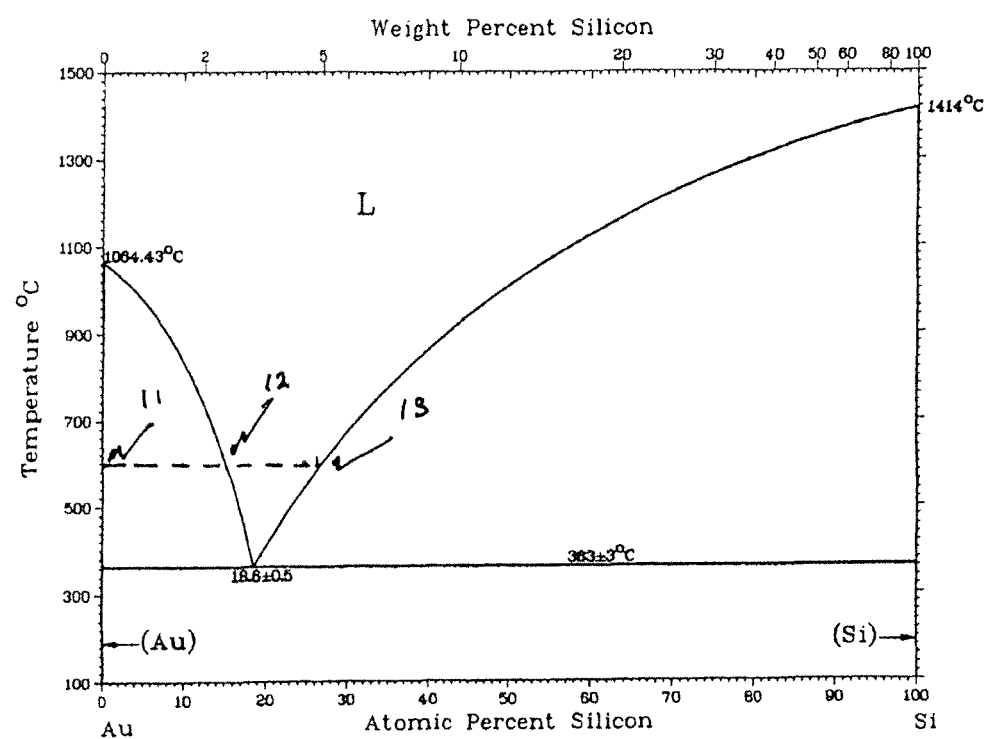

METHODS OF GROWING HETEROEPITAXIAL SINGLE CRYSTAL OR LARGE GRAINED SEMICONDUCTOR FILMS AND DEVICES THEREON

The present invention is a continuation-in-part of U.S. patent application Ser. No. 13/929,085 filed Jun. 27, 2013 (U.S. Pat. No. 9,722,130), which is a continuation of U.S. patent application Ser. No. 12/903,750 filed Oct. 13, 2010 (U.S. Pat. No. 8,491,718), which is a continuation-in-part of U.S. patent application Ser. No. 12/774,465 filed May 5, 2010 (U.S. Pat. No. 9,054,249), which is a continuation of U.S. patent application Ser. No. 12/154,802filed May 28, 2008, which is now abandoned, all of which are hereby incorporated by reference in their entirety.

REFERENCES CITED

U.S. Patent Documents
U.S. Pat. No. 4,717,688 January 1987 Jaentsch . . . 148/171
U.S. Pat. No. 5,326,719 July 1994 Green et al . . . 427/74
U.S. Pat. No. 5,544,616 August 1996 Ciszek et al . . . 117/60
U.S. Pat. No. 6,429,035 B2 August 2002 Nakagawa et al . . . 438/57
U.S. Pat. No. 6,784,139 B1 August 2004 Sankar et al . . . 505/230

OTHER PUBLICATIONS

Kass et al, Liquid Phase Epitaxy of Silicon: Potentialities and Prospects", Physica B, Vol 129, 161 (1985)
Massalski et al, "Binary Alloy Phase Diagrams", $2^{nd}$ edition, (1990), ASM International
Findikoglu et al, "Well-oriented Silicon Thin Films with High Carrier Mobility on Polycrystalline Substrates", Adv. Materials, Vol. 17, 1527, (2005)
Teplin et al, "A Proposed Route to Thin Film Crystal Si Using Biaxially Textured Foreign Template Layers" Conference paper NREL/CP-520-38977, November 2005
Goyal et al., "The RABiTS approach: Using Rolling-assisted Biaxially Textured Substrates for High-performance YBCO Superconductors," MRS Bulletin, Vol. 29, 552, (2004)
Nast et al, "Aluminum Induced Crystallization of Amorphous Silicon on Glass Substrates Above and Below the Eutectic Temperature", Appl. Phys. Lett., Vol 73, 3214, (1998)
Girault et al, "Liquid Phase Epitaxy of Silicon at very low Temperatures", J. Crystal Growth, Vol 37, 169 (1977)
Kayes et al, "Comparison of the Device Physics Principles of Planar and Radial p-n junction Nanorod Solar Cells", J. Appl. Phys., Vol. 97, 114302, (2005)

FIELD OF THE INVENTION

The present invention is related to producing large grained to single crystal semiconductor films, such as silicon films, for producing articles such as photovoltaic and other electronic devices.

FEDERAL FUNDING

None

BACKGROUND OF THE INVENTION

It is widely known that radiation from the sun striking earth provides enough energy to supply all of mankind's needs for energy for the indefinite future. Such a source of energy can be clean and environmentally benign.

It is also widely known that global warming is associated with the use of fossil fuels, such as coal, oil, and natural gas. It is accepted by the scientific community that global warming can have severe adverse effects around the planet. There are numerous efforts around the world, combined with a sense of urgency, to cut down emissions from the usage of fossil fuels. A dominant factor in favor of the continual use of fossil fuels is their cost per unit of available energy. If, for example, the cost of producing photovoltaic cells can be reduced by a factor of approximately three while maintaining efficiency of conversion, the photovoltaic technology would become cost competitive with fossil fuels.

A major cost component in photovoltaic cells is the cost of the substrate on which the semiconductor film capable of converting sunlight into electricity is placed. The most widely used substrate is single crystal silicon (Si). These substrates developed for the microelectronics industry have been modified for application in photovoltaic technology. If a silicon film could be deposited on an inexpensive substrate, such as glass, and with comparable quality as that found in silicon single crystals used in the microelectronics industry, the cost of photovoltaic technology would drop significantly.

Epitaxial growth of thin films is a very well established process. It has been investigated by hundreds of researchers. Epitaxial deposition provides a very viable way of growing very good quality films. Many single crystal semiconductors and insulator surfaces are used to study the epitaxial growth of metallic films; for example, the growth of silver on silicon, sapphire, or a mica surface. Epitaxial metallic films have also been grown on other metallic films, such as gold on silver. In contrast to metals, semiconductors, such as silicon, are difficult to grow epitaxially. For example, heteroepitaxial films of silicon have been successfully grown only on sapphire but at temperatures that are relatively high for the applications we disclose here, such as the growth of silicon on glass substrates.

In order to take advantage of highly textured large grained films for photovoltaic technology two problems need to be solved: inexpensive growth of high quality films and the availability of an inexpensive substrate on which desirable properties can be achieved. Here, we disclose a method for growing semiconductor films, such as silicon, satisfying the two requirements listed above and suitable for photovoltaic technology and other electronic applications.

The thermodynamic stability and formation temperature of two or more elements is described by a composition versus temperature diagram, called a phase diagram. In this invention we shall make use of phase diagrams. These phase diagrams are available in the scientific literature (Massalski et al). The phase diagram provides information on the behavior of different phases, solid or liquid as a function of temperature and composition. For example, the liquidus in a simple binary eutectic system, such as Au and Si, shows how the relative composition of the liquid and solid, it is in equilibrium with, changes with temperature. It is therefore possible to choose an average composition, different from the eutectic composition, and cool the mixture in such a way as to precipitate out one phase or the other. If the composition is chosen to be richer in silicon than the eutectic composition then on cooling through the liquidus boundary between the single phase liquid and the two phase liquid plus solid, silicon will nucleate and form a solid phase. If on the other hand it is gold rich relative to the eutectic composition the first solid phase to nucleate is gold rather than silicon.

At and below the eutectic temperature the two components, in this case, Au and Si solidify from the liquid phase to phase separate into the two components Au and Si. The interface energy between the two components is generally positive and therefore drives the two components to aggregate into distinct phases with a minimum of surface area between the two rather than a fine mixture of the two. There is, however, the energetics of two other interfaces to consider also: one with the substrate and the other with vacuum or gas. In considering energetics it is not only the chemical interaction of the metal or Si with the substrate that is important but also its crystallographic orientation, for the surface or interface energy depends upon orientation of the grains. Another concern is the difference in lattice match between the nucleating film and the substrate which can lead to strain induced energy that is minimized by either inducing defects or not growing uniformly in thickness across the substrate surface. These factors determine if silicon is likely to deposit on the substrate (heterogeneous nucleation) or nucleate and forms small crystals in the liquid (homogeneous nucleation).

An advantage of using eutectics compositions is that the eutectic temperature is lower than the melting temperature of the constituent elements. For example, the eutectic temperatures of Au, Al, and Ag with Si are 363, 577, and 835 degrees Centigrade (° C.), respectively. In contrast the melting temperatures of the elements are 1064, 660, and 961° C., respectively. The melting temperature of silicon is 1414° C. The eutectics then offer the possibility of nucleating a silicon crystal from the liquid far below the temperature at which pure liquid silicon crystallizes. By a proper choice of the substrate surface exposed to the nucleating silicon, it is possible to nucleate and grow single crystal or large grained silicon films.

We have discussed silicon eutectics using elements such as Au, Ag, and Al. However, it is possible to replace the elements by silicon based compounds. For example, the compound nickel silicide forms a eutectic with Si. There are numerous other examples of silicide compounds forming a eutectic with Si (Massalski et al). An advantage of using a silicide is that frequently the electrical contact of the silicide with silicon has very desirable properties, such as a good ohmic contact or a Schottky barrier. Some silicides are also known to have an epitaxial relationship with silicon. In this case, by appropriately choosing either a silicide rich or silicon rich melt either the silicon can be induced to grow epitaxially on the silicide or the silicide on silicon. A disadvantage in this approach is the eutectic temperature, which is generally high.

Low temperature solutions can also be formed with some elements, For example, gallium (Ga) and Si have a eutectic temperature of less than 30° C., very close to that of the melting point of Ga. There are other elements, such as indium or tin that form low temperature liquid solutions with silicon. Si can be nucleated from these solutions at very low temperatures relative to pure silicon (Girault et al, Kass et al). These temperatures are sufficiently low that it opens up the possibility of using organic materials as substrates on which large grained to single crystal films can be grown. While this is an advantage, there is also a serious disadvantage; at these low temperatures, the silicon film can contain defects and hence are not very useful as a photovoltaic material. However, these very low temperature deposits can be used to initiate the nucleation of a very thin silicon film, which is subsequently thickened by using higher temperature processes to optimize its photovoltaic properties.

The choice of a particular system (phase diagram) is not only determined by temperature and energetics of the interfaces, but also by the solubility of the second element in Si. It is desirable to have precise control of the doping of Si in order to optimize its semiconductor properties for photovoltaic applications. It is also important to select the composition of the substrate and temperature of processing such that there is minimal or no chemical interaction between the silicon film and the surface of the substrate on which it is being deposited.

From the preceding description, we can extract five common points which are relevant to this invention. First, one end of the phase diagram always has the semiconductor we wish to nucleate and use to produce a film, we have used silicon in the preceding examples but it could be germanium or a compound such as gallium arsenide or cadmium selenide. Second, the thermodynamically predicted concentration of the second element or phase in the semiconductor is minimal. If there is solubility then it must be a desirable dopant. For example aluminum (Al) in silicon behaves as a p-type dopant and experience in the semiconductor industry has shown that trace amount of Al can be desirable. Third, the liquidus curve has the highest temperature on the semiconductor side. In other words, the melting point of the semiconductor is greater than the liquidus for all compositions in equilibrium with the semiconductor. Fourth, the homogeneous nucleation energy of silicon crystal from the melt is greater than that for heterogeneous nucleation on the substrate. This latter condition promotes heterogeneous nucleation. And, fifth, the temperature for epitaxial growth is low enough to use inexpensive substrates such as glass but high enough to promote a good quality silicon film. For example, a growth temperature above approximately 550 degrees Centigrade (550° C.) is desirable to make a good quality silicon film. The softening temperature of ordinary glasses is around 600° C. The softening temperature of borosilicate glasses is higher. However it is not high enough to use conventional deposition temperature of greater than 750 degrees Centigrade for silicon on insulator, such as a sapphire substrate.

In order to take full advantage of the invention disclosed here the semiconductor material has to be deposited on a substrate material which is inexpensive, and the surface of which enables heterogeneous nucleation and growth. In the following we shall discuss two specific methods for producing substrates suitable for heterogeneous deposition of films for photovoltaic technology. Both of these methods have been described in the scientific literature and we do not claim to invent them. We include them here for completeness.

The use of rolled and textured Ni and Ni-alloy sheets has been proposed as substrate material for superconducting films and, more recently, for films for photovoltaic devices (Findikoglu et al). In order to facilitate the growth of epitaxial superconducting films on such substrates, there have been two approaches described in the scientific literature: in one the sharp rolling texture produced in a rolled and annealed Ni alloy is used as a template on which various epitaxial buffer layers are deposited followed finally by an epitaxial film of a high temperature cuprate superconductors (Goyal et al). In the second approach (Findikoglu et al), the nickel ribbon is used as a substrate for ion beam assisted deposition of a wide variety of highly textured ceramics, for example, magnesium oxide (MgO). The ion beam aligns the growing MgO film, which provides a template for the subsequent deposition of the cuprate superconductor. The latter approach is not limited to using metal tapes but can be extended to other inexpensive substrates such as glass (Teplin et al). It has been found that texture can also be induced in MgO by depositing the film on a substrate that is inclined to the normal from the oncoming vapor of MgO.

One limitation of the use of glass as a substrate has been its softening temperature, which is generally lower than the conventional processing temperatures required for the growth of large grained or single crystal films of silicon. With the method of depositing silicon films at low temperatures, described in this invention, the use of buffered glass becomes an option for we can deposit highly textured and large grained silicon on MgO at or below the softening temperature of glass. Similarly, researchers have grown crystalline aluminum oxide ($Al_2O_3$) on inexpensive substrates (Findikoglu et al). We shall use MgO and $Al_2O_3$ as illustrative examples. However, it is understood to those skilled in the art that a variety of other materials can also work. Both Findikoglu et al and Goyal et al describe other buffer layers, including conducting ceramic layers, such as TiN.

OBJECT OF THE INVENTION

It is an object of the present invention to provide single crystal or highly textured relatively large grained good quality semiconductor films and, in particular silicon films, for photovoltaic technology or other semiconductor devices, such as field effect transistors used, for example, in displays.

It is yet another object of this invention to provide single crystal or highly textured relatively large grained good quality semiconductor films and, in particular silicon films, at low temperatures. For example, if silicon films are used, the growth temperature is between 450 and 750 degrees Centigrade.

It is yet another object of this invention to provide single crystal or highly textured relatively large grained good quality semiconductor films and, in particular silicon films, on inexpensive substrates, for example, substrates such as glass on which buffer layers such as MgO and/or $Al_2O_3$ have been deposited.

SUMMARY OF THE INVENTION

In accordance with one aspect of the present invention, the forgoing and other objects can be achieved by alloying a semiconductor and, in particular silicon, with elements or compounds that form an eutectic system, and increasing slowly the concentration of the semiconductor, such as silicon, through the liquidus line to reach the two phase region in which the semiconductor, in particular silicon, nucleates out of the melt and on the surface of a substrate.

In accordance with another aspect of the present invention, the forgoing and other objects can be achieved by alloying a semiconductor and, in particular silicon, with elements or compounds that form an eutectic system, and increasing slowly the concentration of the semiconductor, such as silicon, through the liquidus line to reach the two phase region in which the semiconductor, in particular silicon, nucleates on the surface of a substrate to produce a highly textured relatively large grained or single crystalline film.

In accordance with yet another aspect of the present invention, the forgoing and other objects can be achieved by alloying a semiconductor and, in particular silicon, with elements or compounds that form an eutectic system, and increasing slowly the concentration of the semiconductor, such as silicon, through the liquidus line to reach the two phase region in which the semiconductor, in particular silicon, nucleates on the surface of a substrate made of a buffered tape in which texture is produced by mechanical deformation and the buffer layers are epitaxial to the texture of the metal tape. The buffer layer exposed to the melt comprises of compounds, such as $Al_2O_3$ or MgO.

In accordance with yet another aspect of the present invention, the forgoing and other objects can be achieved by alloying a semiconductor and, in particular silicon, with elements or compounds that form an eutectic system, and increasing slowly the concentration of the semiconductor, such as silicon, through the liquidus line to reach the two phase region in which the semiconductor, in particular silicon, nucleates on the surface of a substrate made of a buffered tape, a glass substrate, or any other material suitable for inexpensive manufacture of photovoltaic cells in which strong texture is produced by ion beam assisted deposition. The final layer, which is exposed to the silicon melt, comprises of compounds, such as $Al_2O_3$ or MgO.

In accordance with still another aspect of the present invention, the forgoing and other objects can be achieved by using a solid phase composition comprising a semiconductor and, in particular silicon, with elements or compounds that form an eutectic system, and in which a thin film of the element or compound is deposited first followed by the semiconductor, such as silicon, and depositing at a temperature where the semiconductor atoms diffuse through the element or compound to heterogeneously nucleate on the substrate and propagate this crystallinity to the semiconductor film remaining on top of the element or compound.

The method of manufacture of materials suitable for photovoltaic technologies described in this invention are much less expensive in the conversion of sunlight into electricity than those practiced in the prior art.

BRIEF DESCRIPTION OF THE DRAWINGS

FIG. 1 shows the phase diagram of the eutectic system Au—Si, taken from the literature (Massalski et al). The melting points of the two elements Au and Si, as well as the eutectic temperature are shown in the FIGURE. The eutectic composition is also indicated. The liquidus line, which defines the boundary between the liquid gold-silicon alloy and solid silicon and a gold-silicon liquid alloy, and on the silicon rich side of the phase diagram, is marked. The FIGURE also shows the change in phases as the composition is changed by depositing silicon on a film of gold held at constant temperature. As the silicon is evaporated on to the gold film, the film comprises of gold solid and a liquid gold-silicon alloy which changes from the point marked by 11 towards 12. Further deposition of silicon results in the film entering the liquid phase region between the points marked 12 and 13. As the silicon deposition continues beyond the point 13, the liquidus boundary, solid silicon nucleates from the liquid which is in equilibrium with a silicon-gold liquid alloy. The solid silicon is deposited on a MgO substrate, forming a highly textured and relatively large grained heterogeneously nucleated film. The thickness of the solid silicon film increases till the deposition is stopped. As it cools Si continues to deposit from the melt while the Au—Si liquid solution becomes richer in gold. This process continues till the eutectic temperature is reached, at which point the liquid solidifies and phase separates into gold and silicon solids.

We have used the phase diagram of the Au—Si eutectic. The Al—Si eutectic is very similar. Here we can heterogeneously nucleate silicon from the Al—Si melt on a single crystal sapphire substrate to form a single crystal heteroepitaxial silicon film.

DETAILED DESCRIPTION OF THE INVENTION

As described above, we have disclosed a method to produce low cost single crystal or large grained epitaxially aligned good quality semiconductor films, in particular silicon, for photovoltaic technology. We have also suggested the use of tapes or glass slabs as substrate materials. The tapes provide strong texture on which buffer layers suitable for silicon growth are present. Our method can produce silicon epitaxy at substantially lower temperatures than those commonly practiced, hence not only minimizing interaction with the surface of the substrate but also enabling the use of glass substrates.

We shall be using the eutectics of silicon with gold and aluminum in describing the details of the invention. It is, however, understood that one skilled in the art can extend the methodology to other semiconductors such as germanium, gallium arsenide, or the cadmium selenide class of photovoltaic materials.

FIG. 1 shows the phase diagram of the eutectic system Au—Si. The eutectic composition is nominally 18.6 atomic percent pct Si and the rest being gold. A thin gold film is first deposited on the buffered substrate. This is followed by silicon deposition. As the silicon concentration increases the film first forms a two phase mixture of gold and liquid gold-silicon. The composition of the latter is determined by the choice of the deposition temperature. With further increase of silicon, the liquid phase region, marked 12, is reached and the remaining gold is dissolved. With still further increase of the amount of silicon, the second liquidus phase boundary, marked 13, is reached and subsequent deposition of silicon atoms results in a solid phase of silicon in equilibrium with the silicon-gold liquid. If the substrate surface is suitably chosen, for example MgO crystals, the solid silicon nucleates heterogeneously onto the surface. The choice of the temperature of deposition is determined by balancing two considerations: quality in terms of defects of the epitaxial film; too low a temperature or too rapid a growth rate of the film at that temperature can introduce defects versus too high a temperature when chemical interaction or mechanical integrity of the substrate limit the usefulness of the material.

We have started with vapor deposition of the metallic film and added silicon to it to traverse the phase diagram from point marked 11 in the FIGURE. However, the metallic element and silicon can be co evaporated to reach any concentration between the points marked 12 and 13 in the FIGURE and subsequently silicon added to reach the desired thickness, before cooling to room temperature.

When the desired thickness of the silicon film is obtained, the substrate with the film is cooled to room temperature. Even though the amount of gold required to catalyze a silicon film is small, it can be further reduced by etching the gold away, for example, by using iodine etch, available commercially. This gold can be recycled.

Example of Invention

A good high vacuum system with two electron beam guns, is used to deposit tin and silicon independently. A glass substrate coated with textured MgO is held at temperatures between 575 and 600° C. These are nominal temperatures. It is understood to one skilled in the art that lower or higher temperatures can also be used depending upon the softening temperature of the glass substrate or the reaction kinetics of either tin or silicon with the MgO layers when used as substrates. A thin tin film of approximately 10 nm thickness is deposited first. This is followed by a silicon film deposited at a rate of 2 nm per minute on top of the tin film. The silicon film nucleates heterogeneously on the MgO surface to form the desired thin film. The film can now be cooled to room temperature, where the film now comprises of two phases: tin and a relatively large grained and highly textured film of silicon on MgO. The tin diffuses to the surface of the silicon film, driven by its lower surface energy relative to the silicon surface. Rather than etching the film in a solution, which removes the Sn from the two phases, tin and silicon, leaving behind a silicon film the Sn in the Si—Sn film can now be converted to tin oxide ($SnO_2$) by simply introducing $O_2$. The $SnO_2$ layer can serve as a transparent conducting oxide (TCO), interfacial conducting layer (ICL), or a recombination layer in the case of the perovskite film deposition. Moreover, as the $SnO_2$ film is formed on the textured silicon, the $SnO_2$ film is also textured and this texture can in turn be replicated in a wide bandgap material such as a polymer for example PEDOT:PSS or P3HT, or perovskite for example MASnI which in turn is deposited on it to form the top cell. Instead of a silicon layer as the bottom cell, another inorganic semiconductor material such as germanium can be used with tin and have the same results. For the Si—Sn deposition two electron beam guns can be used, as an illustrative example. By wide bandgap it is meant a material having a bandgap greater than 1.1 eV. A low bandgap material has an eV less than 1.1 eV. Ideally, the wide bandgap material should have an eV of 1.8 when combined with silicon, which has an eV of 1.1. It is understood to one skilled in the art that other methods such as a single gun with multiple hearths, chemical vapor deposition, thermal heating, or sputtering can also be used. For the polymer or perovskite film deposition, various techniques known in the art, such as spin-coating, sputtering, or electron beam evaporation, can be used. Since the tin-silicon eutectic temperature or crystallization temperature is low, the entire deposition process can take place in vacuum "in-line"—without breaking vacuum.

The invention claimed is:
1. A method of making a thin-film semiconductor device comprising the steps of:
   depositing a textured buffer layer on a substrate,
   depositing an inorganic film from a metal-semiconductor eutectic alloy on said buffer layer, wherein said metal diffuses to the surface of said inorganic film,
   introducing $O_2$ to the metal and thereby transforming the metal to a metal oxide, and
   depositing a semiconductor film on said metal oxide layer to form a semiconductor device.
2. The method of claim 1, wherein said semiconductor film is a polymer.
3. The method of claim 1, wherein said semiconductor film is a perovskite.
4. The method of claim 1, wherein said metal is Sn.
5. The method of claim 1, wherein said metal is Al.
6. The method of claim 1, wherein said metal oxide is $SnO_2$.
7. The method of claim 1, wherein said metal oxide is $Al_2O_3$.
8. The method of claim 1, wherein said metal oxide is indium tin oxide.

9. The method of claim 1, wherein said inorganic film, said metal oxide film, and said semiconductor film are all textured.

10. The method of claim 1, wherein said inorganic film has a narrow bandgap (<1.1 eV).

11. The method of claim 1, wherein said semiconductor film has a wide bandgap (>1.1 eV).

12. The method of claim 1, wherein said semiconductor film has a bandgap of 1.8 eV.

13. The method of claim 2, wherein said polymer is P3HT.

14. The method of claim 3, wherein said perovskite is MASnI.

* * * * *